United States Patent
Ahmed

(10) Patent No.: US 9,246,013 B2
(45) Date of Patent: Jan. 26, 2016

(54) IGZO DEVICES WITH COMPOSITE CHANNEL LAYERS AND METHODS FOR FORMING THE SAME

(71) Applicant: Intermolecular, Inc., San Jose, CA (US)

(72) Inventor: Khaled Ahmed, Anaheim (CA)

(73) Assignee: Intermolecular, Inc., San Jose, CA (US)

( * ) Notice: Subject to any disclaimer, the term of this patent is extended or adjusted under 35 U.S.C. 154(b) by 167 days.

(21) Appl. No.: 14/133,521

(22) Filed: Dec. 18, 2013

(65) Prior Publication Data

US 2015/0171227 A1   Jun. 18, 2015

(51) Int. Cl.
*H01L 29/12* (2006.01)
*H01L 29/786* (2006.01)
*H01L 29/66* (2006.01)
*H01L 21/02* (2006.01)

(52) U.S. Cl.
CPC .... *H01L 29/78693* (2013.01); *H01L 21/02472* (2013.01); *H01L 21/02483* (2013.01); *H01L 21/02538* (2013.01); *H01L 21/02554* (2013.01); *H01L 21/02565* (2013.01); *H01L 21/02592* (2013.01); *H01L 21/02595* (2013.01); *H01L 21/02631* (2013.01); *H01L 29/66765* (2013.01)

(58) Field of Classification Search
CPC .................................................. H01L 29/78693
USPC ............................................................. 257/43
See application file for complete search history.

(56) References Cited

U.S. PATENT DOCUMENTS

| | | | |
|---|---|---|---|
| 8,349,669 B2 | 1/2013 | Ye | |
| 2010/0065842 A1 | 3/2010 | Yamazaki et al. | |
| 2010/0181565 A1* | 7/2010 | Sakata et al. | 257/43 |
| 2011/0127521 A1 | 6/2011 | Yamazaki | |
| 2012/0051119 A1 | 3/2012 | Yamazaki et al. | |
| 2012/0119211 A1 | 5/2012 | Lin et al. | |
| 2012/0267621 A1* | 10/2012 | Chen et al. | 257/43 |
| 2013/0168682 A1 | 7/2013 | Tu et al. | |

OTHER PUBLICATIONS

Lee et al.; Band alignment of InGaZnO4/Si interface by hard x-ray photoelectron spectroscopy; Aug. 9, 2012; Journal of Applied Physics; American Institute of Physics; pp. 033713-1-033713-6.

* cited by examiner

*Primary Examiner* — Andy Huynh
*Assistant Examiner* — Sitaramarao S Yechuri

(57) ABSTRACT

Embodiments described herein provide indium-gallium-zinc oxide (IGZO) devices, such as IGZO thin-film transistors (TFTs), and methods for forming such devices. A substrate is provided. A gate electrode is formed above the substrate. An IGZO channel layer is formed above the gate electrode. The IGZO channel layer has a first sub-layer including c-IGZO and a second sub-layer including a-IGZO. A source electrode and a drain electrode are formed above the IGZO channel layer.

10 Claims, 9 Drawing Sheets

US 9,246,013 B2

IGZO DEVICES WITH COMPOSITE CHANNEL LAYERS AND METHODS FOR FORMING THE SAME

TECHNICAL FIELD

The present invention relates to indium-gallium-zinc oxide (IGZO) devices. More particularly, this invention relates to methods for forming IGZO devices, such as thin-film transistors (TFTs), with composite channel layers and methods for forming such devices.

BACKGROUND OF THE INVENTION

Indium-gallium-zinc oxide (IGZO) devices, such as IGZO thin-film transistors (TFTs) have attracted a considerable amount of attention due to the associated low cost, room temperature manufacturing processes with good uniformity control, high mobility for high speed operation, and the compatibility with transparent, flexible, and light display applications. Due to these attributes, IGZO TFTs may even be favored over low cost amorphous silicon TFTs and relatively high mobility polycrystalline silicon TFT for display device applications. IGZO devices typically utilize amorphous IGZO (a-IGZO).

Recent developments in the field suggest that the use of crystalline IGZO may provide improved electrical and chemical stability. However, the use of crystalline IGZO may inhibit the performance of the device to relatively high contact resistivity with the source and drain electrodes.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Some embodiments described herein provide indium-gallium-zinc oxide (IGZO) devices, such as IGZO thin-film transistors (TFTs), with improved (i.e., reduced) electrode contact resistivity, while still maintaining the high channel mobility normally associated with the use of IGZO channels, particularly those using crystalline IGZO (c-IGZO).

In some embodiments, the electrode contact resistivity is reduced by forming an amorphous IGZO (a-IGZO) layer between the (crystalline) IGZO channel and the source and drain electrodes (or by forming a composite, or bi-layer, IGZO channel having a crystalline IGZO layer and an amorphous IGZO layer).

In some embodiments, the IGZO channel is formed by first depositing (e.g., using physical vapor deposition (PVD)) crystalline IGZO. The crystalline structure of the IGZO may be enhanced by forming the IGZO using particular processing conditions and/or during an annealing process. After the crystalline IGZO (or c-IGZO) is formed, a thin layer of IGZO is formed above in such a way that it remains substantially amorphous (e.g., it is deposited after the annealing process).

Figure 1:
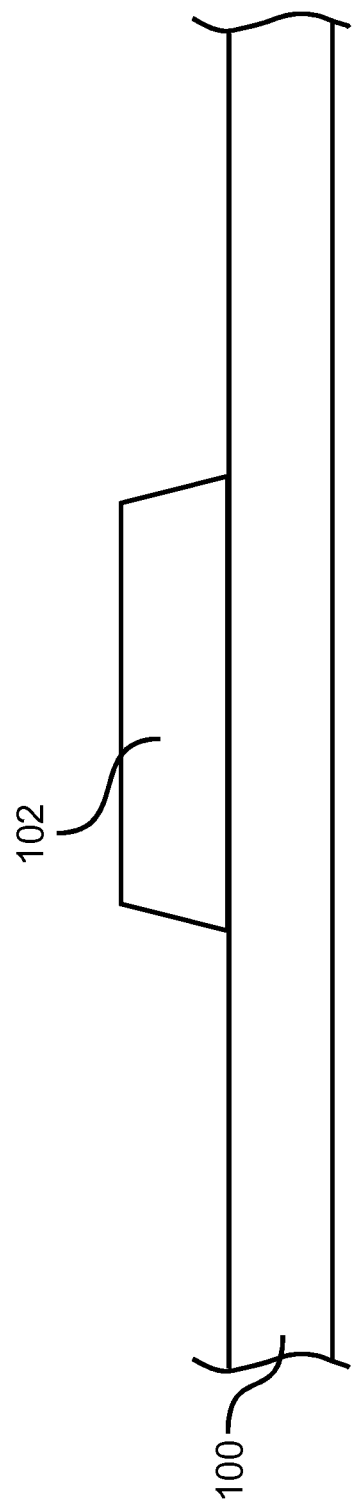
FIG. 1 is a cross-sectional view of a substrate with gate electrode formed above.

FIGS. 1-7 illustrate a method for forming an IGZO TFT (or more generically, an IGZO device), according to some embodiments. Referring now to FIG. 1, a substrate 100 is shown. In some embodiments, the substrate 100 is transparent and is made of, for example, glass. The substrate 100 may have a thickness of, for example, between about 0.01 centimeters (cm) and about 0.5 cm. Although only a portion of the substrate 100 is shown, it should be understood that the substrate 100 may have a width of, for example, between about 5.0 cm and about 4.0 meters (m). Although not shown, in some embodiments, the substrate 102 may have a dielectric layer (e.g., silicon oxide) formed above an upper surface thereof. In such embodiments, the components described below are formed above the dielectric layer. Also, in some embodiments, the substrate 100 is at least partially made of a of a semiconductor material (e.g., silicon, germanium, gallium arsenide, etc.). For example, in some embodiments, the substrate includes glass with a layer of semiconductor material formed thereon.

Still referring to FIG. 1, a gate electrode 102 is formed above the substrate 100. In some embodiments, the gate electrode 102 is made of a conductive material, such as copper, silver, aluminum, manganese, molybdenum, or a combination thereof. The gate electrode may have a thickness of, for example, between about 20 nanometers (nm) and about 500 nm. Although not shown, it should be understood that in some embodiments, a seed layer (e.g., a copper alloy) is formed between the substrate 100 and the gate electrode 102.

It should be understood that the various components on the substrate, such as the gate electrode 102 and those described below, are formed using processing techniques suitable for the particular materials being deposited, such as PVD (e.g., co-sputtering in some embodiments), chemical vapor deposition (CVD), plasma-enhanced CVD (PECVD), electroplating, etc. Furthermore, although not specifically shown in the figures, it should be understood that the various components formed above the substrate 100, such as the gate electrode 102, may be sized and shaped using a photolithography process and an etching process, as is commonly understood, such that the components are formed above selected regions of the substrate 100.

Figure 2:
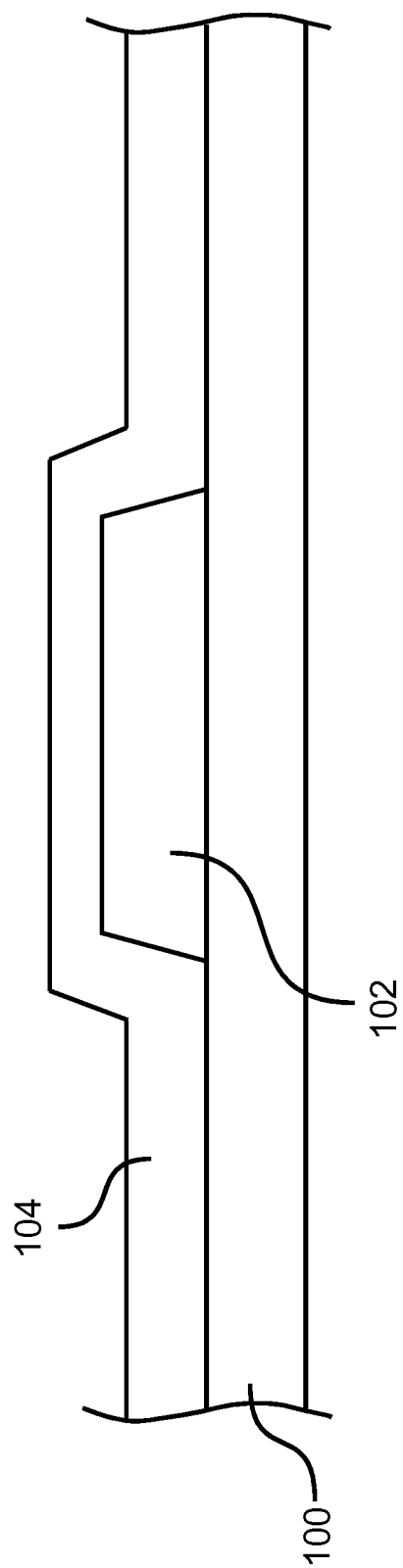
FIG. 2 is a cross-sectional view of the substrate of FIG. 1 with a gate dielectric layer formed above the gate electrode and the substrate.

Referring to FIG. 2, a gate dielectric layer 104 is then formed above the gate electrode 102 and the exposed portions of the substrate 100. The gate dielectric layer 104 may be made of, for example, silicon oxide, silicon nitride, or a high-k dielectric (e.g., having a dielectric constant greater than 3.9), such as zirconium oxide, hafnium oxide, or aluminum oxide. In some embodiments, the gate dielectric layer 104 has a thickness of, for example, between about 10 nm and about 500 nm.

Figure 3:
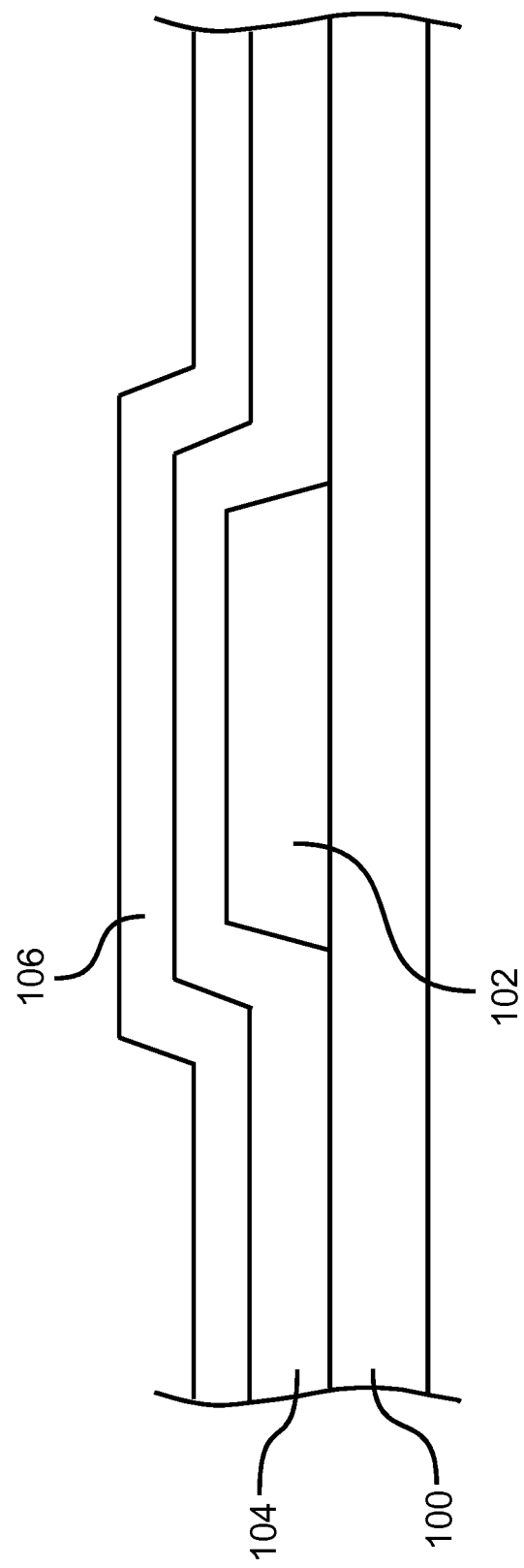
FIG. 3 is a cross-sectional view of the substrate of FIG. 2 with an indium-gallium-zinc oxide (IGZO) layer formed above the gate dielectric layer.

As shown in FIG. 3, an IGZO layer 106 is then formed above the gate dielectric layer 104. The IGZO layer 106 may be made of IGZO in which a ratio of the respective elements is, for example, 1:1:1:1-3. In some embodiments, the IGZO within the IGZO layer 106 is deposited as amorphous IGZO (a-IGZO). However, in some embodiments, the IGZO is formed or deposited using processing conditions to enhance the crystalline structure thereof. In some embodiments, the IGZO layer 106 is formed using PVD. The IGZO may be deposited from a single target that includes indium, gallium, and zinc (e.g., an indium-gallium-zinc alloy target or an IGZO target), but two or more targets may also used (e.g., co-sputtering with an indium-zinc target and a gallium target). The IGZO layer 106 may have a thickness of, for example, between about 10 nm and about 100 nm.

Although not specifically shown, in some embodiments, the IGZO layer 106 (and the other components shown in FIG. 3) may then undergo an annealing process. In some embodiments, the annealing process includes a relatively low temperature (e.g., less than about 600° C., preferably less than about 450° C.) heating process in, for example, an ambient gaseous environment (e.g., nitrogen, oxygen, or ambient/air) to (further) enhance the crystalline structure of the IGZO. The heating process may occur for between about 1 minute and about 200 minutes. After the annealing (or heating) process, the IGZO layer 106 may (substantially) include crystalline IGZO (c-IGZO). As used herein a "crystalline" material (e.g., c-IGZO) may be considered to be one that is more than 30% crystalline by volume, as determined by a technique such as X-ray Diffraction (XRD). In some embodiments, the c-IGZO is c-axis aligned crystal (CAAC) IGZO, as is commonly understood.

Figure 4:
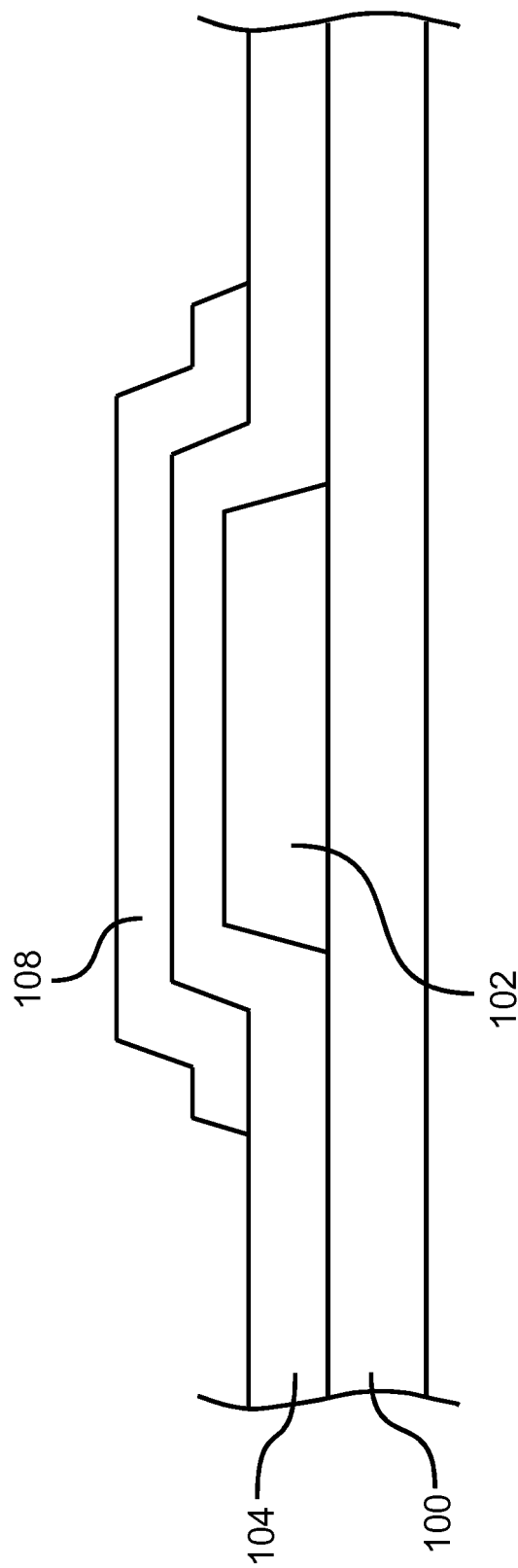
FIG. 4 is a cross-sectional view of the substrate of FIG. 3 with a first IGZO channel sub-layer formed above the gate dielectric layer.

Referring to FIG. 4, after the annealing process, the IGZO layer 106 is patterned (i.e., selectively etched) to form a first (or lower) IGZO channel sub-layer 108 (e.g., made of substantially c-IGZO) above the gate dielectric layer 104, over the gate electrode 102.

Figure 5:
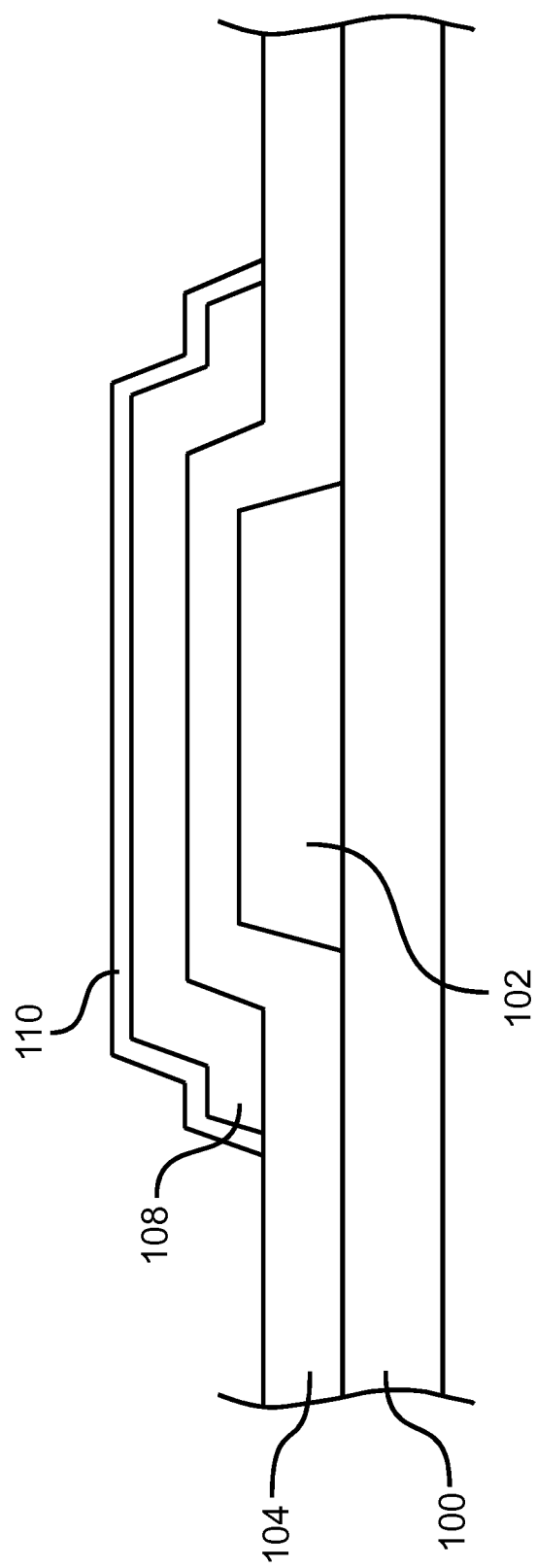
FIG. 5 is a cross-sectional view of the substrate of FIG. 4 with a second IGZO channel sub-layer formed above the first IGZO channel sub-layer.

Next, as shown in FIG. 5, a second (or upper) IGZO channel sub-layer 110 is formed above the first IGZO channel sub-layer 108. In some embodiments, the second IGZO channel sub-layer 110 is made of a-IGZO in a ratio of the respective elements is, for example, 1:1:1:1-3. The second IGZO channel sub-layer 110 may have a thickness of, for example, between about 3 nm and about 15 nm, such as about 10 nm. In some embodiments, the second IGZO channel sub-layer is formed using PVD. The first IGZO channel sub-layer 108 and the second IGZO channel sub-layer 110 may be considered to jointly form an IGZO channel layer, or more particularly, a composite (or bi-layer) IGZO channel layer.

Figure 6:
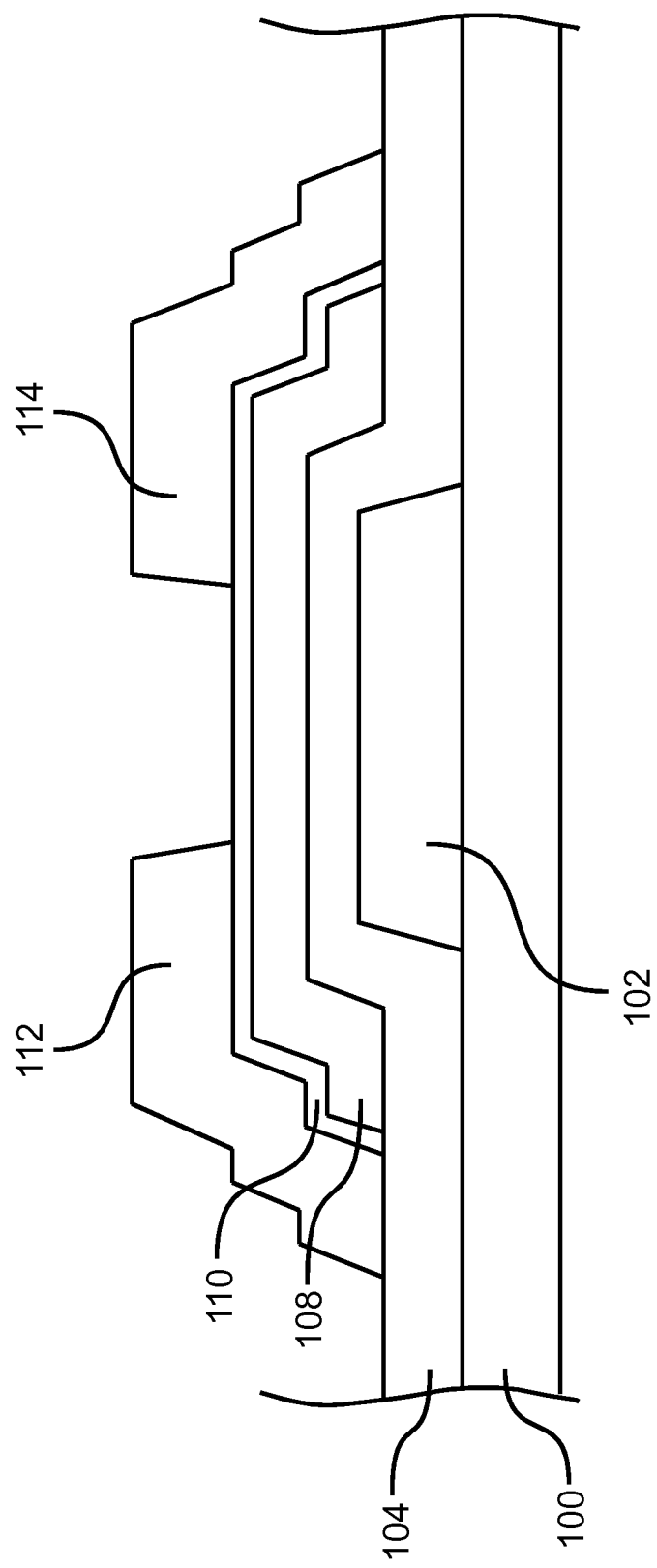
FIG. 6 is a cross-sectional view of the substrate of FIG. 5 with source and drain electrodes formed above the second IGZO channel sub-layer.

Referring now to FIG. 6, a source electrode (or region) 112 and a drain electrode (or region) 114 are then formed above the second IGZO channel sub-layer 110. As shown, the source electrode 112 and the drain electrode 114 lie on opposing sides of, and partially overlap the ends of, the second IGZO channel sub-layer 110 and the first IGZO channel sub-layer 108. As will be appreciated by one skilled in the art, the source electrode 112 and the drain electrode 114 may be defined as shown in FIG. 6 using a "back-channel etch" (BCE) process to, for example, form the gap between the source electrode 112 and the drain electrode 114, which is vertically aligned with the gate electrode 102. However, in some embodiments, an etch-stop layer, as is commonly understood, may be formed above the second IGZO channel sub-layer 110 to facilitate the defining of the source electrode 112 and the drain electrode 114 (e.g., by protecting the IGZO during the etch process).

In some embodiments, the source electrode 112 and the drain region 114 are made of titanium, aluminum, molybdenum, copper, copper-manganese alloy, or a combination thereof. In some embodiments, the source electrode 112 and the drain electrode 114 include multiple sub-layers (e.g., sub-layers of titanium and titanium nitride). The source electrode 112 and the drain electrode 114 may have a thickness of, for example, between about 20 nm and 500 nm.

Figure 7:
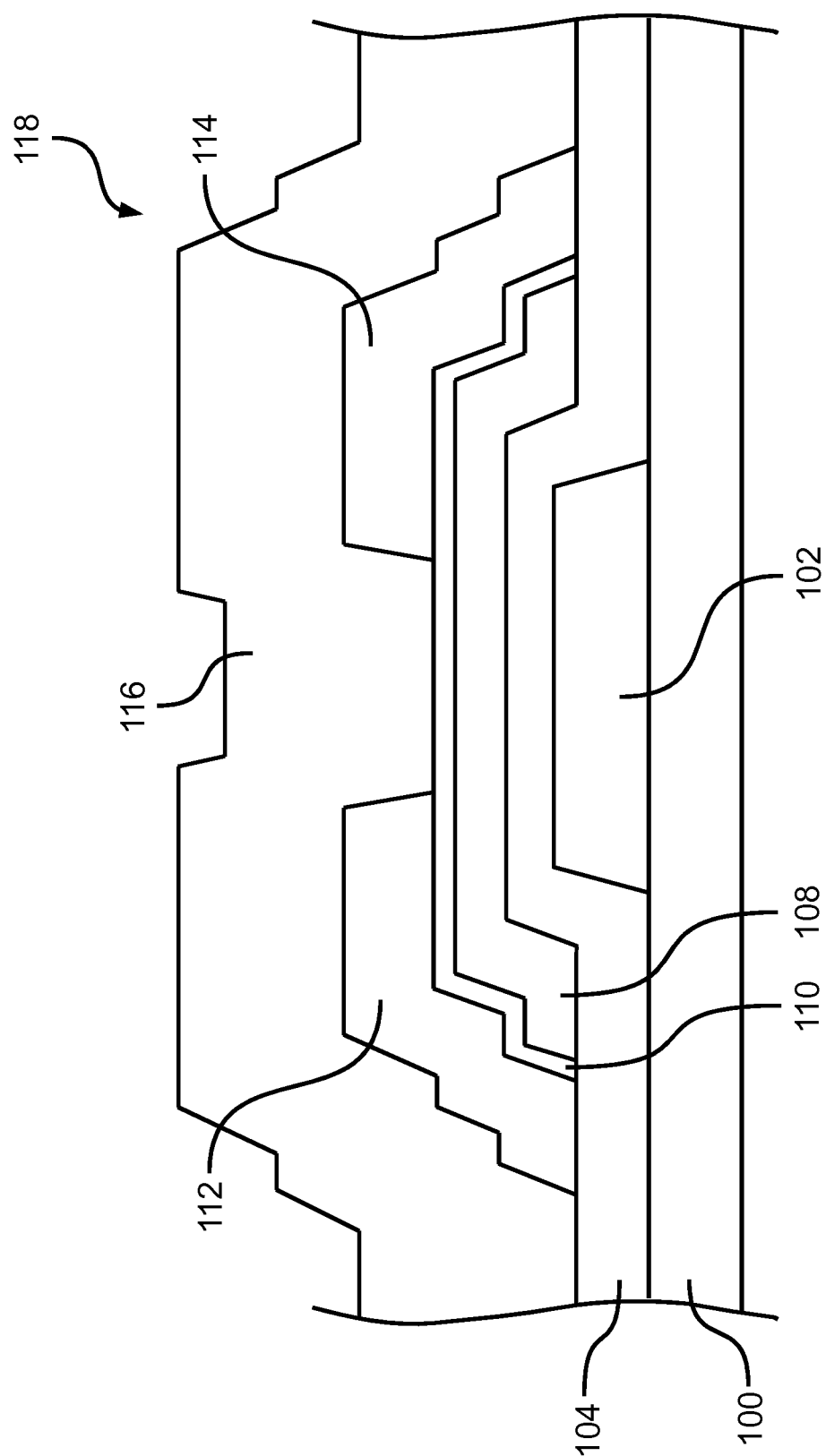
FIG. 7 is a cross-sectional view of the substrate of FIG. 6 with a passivation layer formed above the source and drain electrodes.

Referring to FIG. 7, a passivation layer 116 is then formed above the source electrode 112, the drain electrode 114, and the exposed portions of the gate dielectric layer 104 and the second IGZO channel sub-layer 110. In some embodiments, the passivation layer 116 is made of silicon oxide, silicon nitride, aluminum oxide, aluminum nitride, or a combination thereof and has a thickness of, for example, between about 0.1 μm and about 1.5 μm.

The deposition of the passivation layer 116 may substantially complete the formation of an IGZO device 118, such as an inverted, staggered bottom-gate IGZO TFT. It should be understood that although only a single device 118 is shown as being formed on a particular portion of the substrate 100 in FIGS. 1-7, the manufacturing processes described above may be simultaneously performed on multiple portions of the substrate 100 such that multiple devices 118 are simultaneously formed, as is commonly understood. Further, although not shown, in some embodiments, such as those intended for use in display applications, pixel electrodes may also be formed above the substrate 100 during the formation of the IGZO device(s) 118. The pixel electrodes may be made of a transparent conductive material, such as indium-tin oxide (ITO).

The lower conduction band minimum of a-IGZO (i.e., compared with that of c-IGZO) lowers the Schottky barrier height between the source and drain electrodes and the IGZO (e.g., the c-IGZO) and reduces the activation energy for shallow donor states, leading to higher electron concentration. The contact resistivity decreases exponentially with both the barrier height and the carrier concentration.

Thus, the use of the composite, or bi-layer, IGZO channel(s) described above provides ultra-low specific contact resistivity at the source and drain electrodes. Also, the use of the c-IGZO within the channel provides the device(s) with high channel mobility and electrical and chemical stability, allowing excellent device performance, especially with respect to reliability and longevity. As a result, high performance IGZO devices (e.g., IGZO TFTs) are provided.

Figure 8:
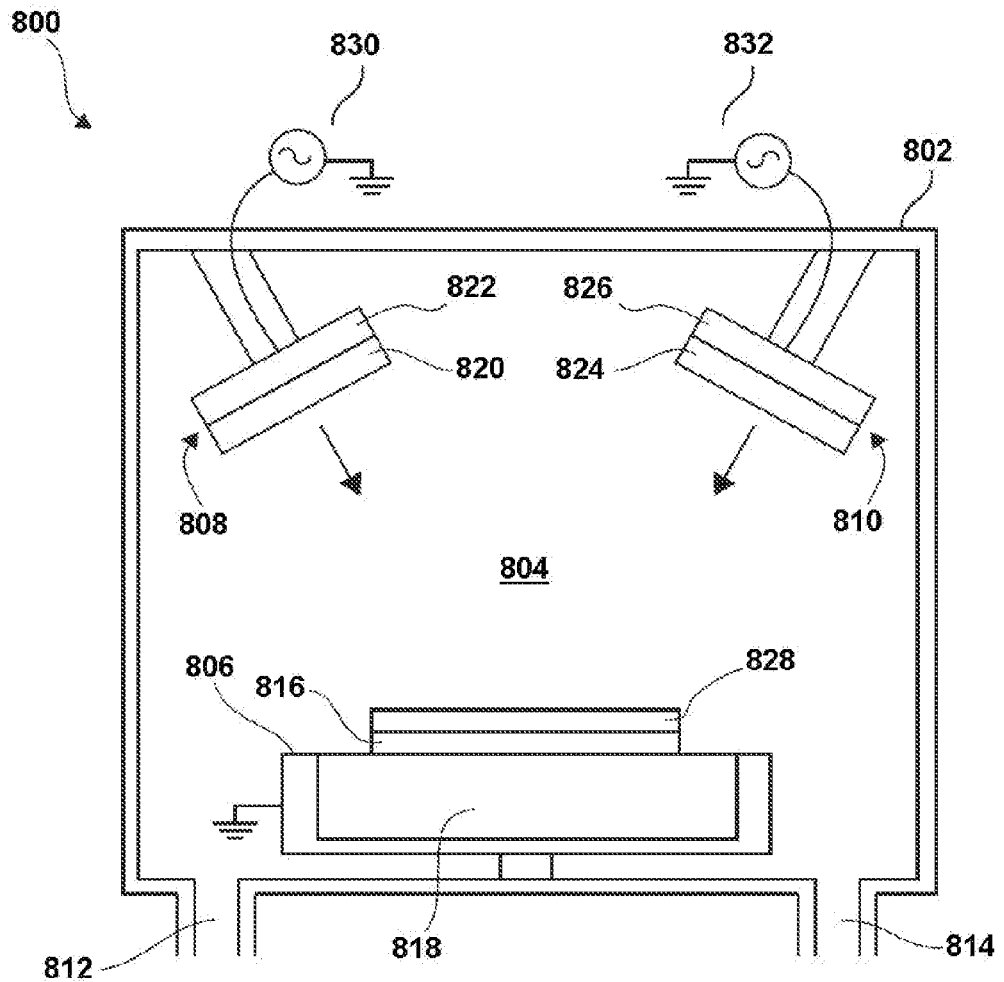
FIG. 8 is a simplified cross-sectional diagram illustrating a physical vapor deposition (PVD) tool according to some embodiments.

FIG. 8 provides a simplified illustration of a physical vapor deposition (PVD) tool (and/or system) 800 which may be used, in some embodiments, to deposit IGZO, such as the IGZO channel sub-layers (and/or other components of the IGZO device), described above. The PVD tool 800 shown in FIG. 8 includes a housing 802 that defines, or encloses, a processing chamber 804, a substrate support 806, a first target assembly 808, and a second target assembly 810.

The housing 802 includes a gas inlet 812 and a gas outlet 814 near a lower region thereof on opposing sides of the substrate support 806. The substrate support 806 is positioned near the lower region of the housing 802 and in configured to support a substrate 816. The substrate 816 may be a round substrate having a diameter of, for example, about 200 mm or about 300 mm. In other embodiments (such as in a manufacturing environment), the substrate 816 may have other shapes, such as square or rectangular, and may be significantly larger (e.g., about 0.5 m to about 4 m across). The substrate support 806 includes a support electrode 818 and is held at ground potential during processing, as indicated.

The first and second target assemblies (or process heads) 808 and 810 are suspended from an upper region of the housing 802 within the processing chamber 804. The first target assembly 808 includes a first target 820 and a first target electrode 822, and the second target assembly 810 includes a second target 824 and a second target electrode 826. As shown, the first target 820 and the second target 824 are oriented or directed towards the substrate 816. As is commonly understood, the first target 820 and the second target 824 include one or more materials that are to be used to deposit a layer of material 828 on the upper surface of the substrate 816.

The materials used in the targets 820 and 824 may, for example, include indium, gallium, zinc, tin, silicon, silver, aluminum, manganese, molybdenum, zirconium, hathium, titanium, copper, or any combination thereof (i.e., a single target may be made of an alloy of several metals). Additionally, the materials used in the targets may include oxygen, nitrogen, or a combination of oxygen and nitrogen in order to form oxides, nitrides, and oxynitrides. Additionally, although only two targets 820 and 824 are shown, additional targets may be used.

The PVD tool 800 also includes a first power supply 830 coupled to the first target electrode 822 and a second power supply 832 coupled to the second target electrode 824. As is commonly understood, in some embodiments, the power supplies 830 and 832 pulse direct current (DC) power to the respective electrodes, causing material to be, at least in some embodiments, simultaneously sputtered (i.e., co-sputtered) from the first and second targets 820 and 824. In some embodiments, the power is alternating current (AC) to assist in directing the ejected material towards the substrate 816.

During sputtering, inert gases (or a plasma species), such as argon or krypton, may be introduced into the processing chamber 804 through the gas inlet 812, while a vacuum is applied to the gas outlet 814. The inert gas(es) may be used to impact the targets 820 and 824 and eject material therefrom, as is commonly understood. In embodiments in which reactive sputtering is used, reactive gases, such as oxygen and/or nitrogen, may also be introduced, which interact with particles ejected from the targets (i.e., to form oxides, nitrides, and/or oxynitrides).

Although not shown in FIG. 8, the PVD tool 800 may also include a control system having, for example, a processor and a memory, which is in operable communication with the other components shown in FIG. 8 and configured to control the operation thereof in order to perform the methods described herein.

Although the PVD tool 800 shown in FIG. 8 includes a stationary substrate support 806, it should be understood that in a manufacturing environment, the substrate 816 may be in motion (e.g., an in-line configuration) during the formation of various layers described herein.

Figure 9:
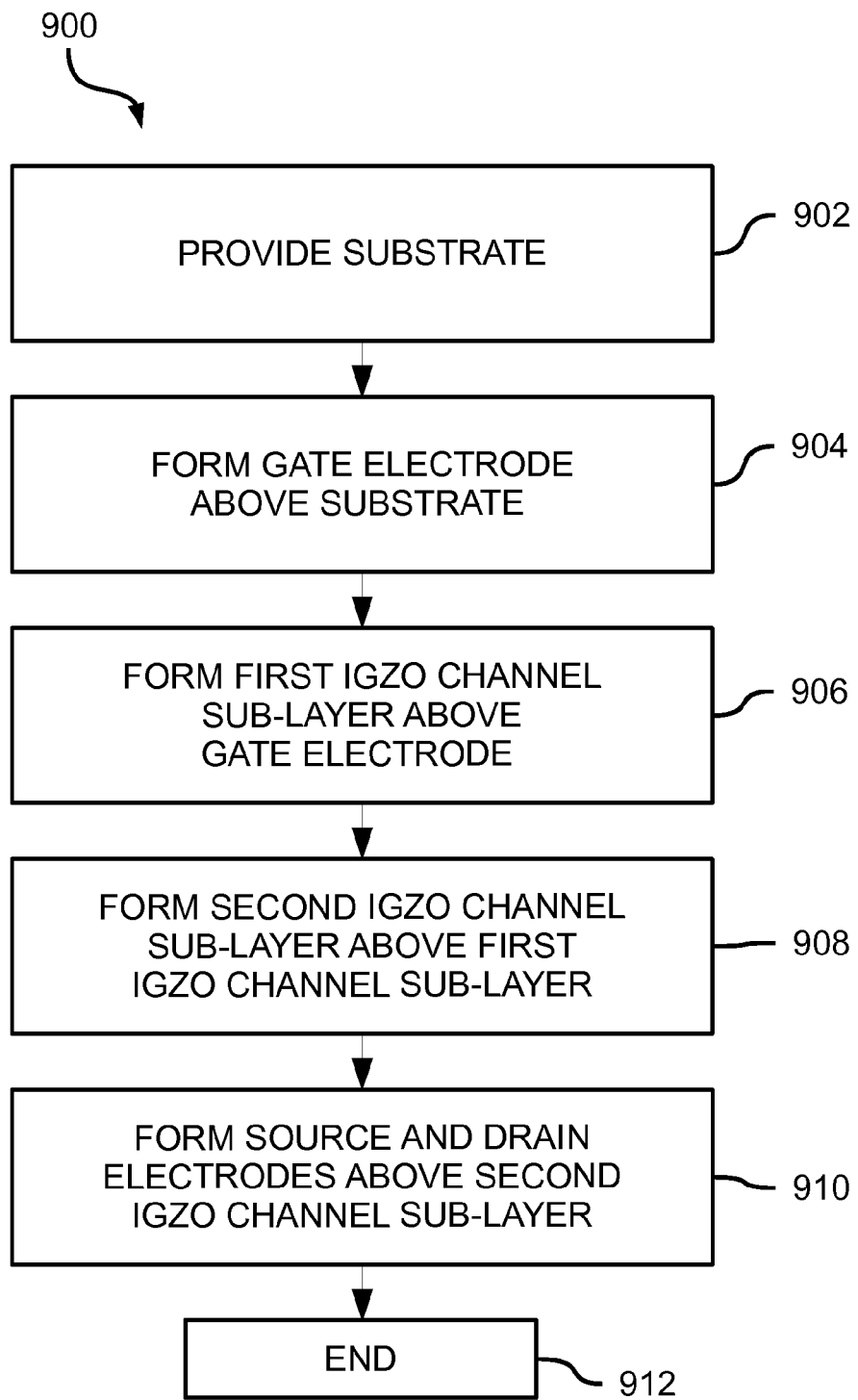
FIG. 9 is a flow chart illustrating a method for forming IGZO devices according to some embodiments.

FIG. 9 illustrates a method 900 for forming IGZO devices, such as IGZO TFTs, according to some embodiments. At block 902, the method 900 begins with a substrate being provided. As described above, in some embodiments, the substrate includes glass, a semiconductor material, or a combination thereof.

At block 904, a gate electrode is formed above the substrate. The gate electrode may be made of a conductive material, such as copper, silver, aluminum, manganese, molybdenum, or a combination thereof.

At block 906, a first IGZO channel sub-layer is formed above the gate electrode. In some embodiments, the first IGZO channel sub-layer includes (or is made of) c-IGZO. The forming of the first IGZO channel sub-layer may include depositing a-IGZO which is then at least partially converted into c-IGZO (e.g., via an annealing process).

At block 908, a second IGZO channel layer is formed above the first IGZO channel sub-layer. In some embodiments, the second IGZO channel sub-layer includes a-IGZO. The second IGZO channel sub-layer made of a thickness of, for example, between about 3 nm and about 15 nm (which may be less than a thickness of the first IGZO channel sub-layer). The first IGZO channel sub-layer and the second IGZO channel sub-layer may jointly form an IGZO channel layer.

At block 910, source and drain electrodes are formed above the second IGZO channel sub-layer (or the IGZO channel layer). The source and drain electrodes may made of, for example, titanium, aluminum, molybdenum, copper, copper-manganese alloy, or a combination thereof.

Although not shown, in some embodiments, the method 900 includes the formation of additional components of an IGZO device, such as a gate dielectric layer and a passivation layer. At block 1208, the method 1200 ends.

Thus, in some embodiments, a method for forming an IGZO device is provided. A substrate is provided. A gate electrode is formed above the substrate. An IGZO channel layer is formed above the gate electrode. The IGZO channel layer has a first sub-layer including c-IGZO and a second sub-layer including a-IGZO. A source electrode and a drain electrode are formed above the IGZO channel layer.

In some embodiments, a method for forming an IGZO device is provided. A substrate is provided. A gate electrode is formed above the substrate. A gate dielectric layer is formed above the gate electrode. An IGZO channel layer is formed above the gate dielectric layer. The IGZO channel layer has a first sub-layer including c-IGZO and a second sub-layer including a-IGZO. The second sub-layer is formed above the first sub-layer. A source electrode and a drain electrode are formed above the IGZO channel layer.

In some embodiments, an IGZO device is provided. The IGZO device includes a substrate. A gate electrode is formed above the substrate. An IGZO channel layer is formed above the gate electrode. The IGZO channel layer has a first sub-layer including c-IGZO and a second sub-layer including a-IGZO. A source electrode and a drain electrode are formed above the IGZO channel layer.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming an indium-gallium-zinc oxide (IGZO) device, the method comprising:
   providing a substrate;
   forming a gate electrode above the substrate;
   forming an IGZO channel layer above the gate electrode, wherein the IGZO channel layer comprises a first sub-layer comprising crystalline IGZO and a second sub-layer comprising amorphous IGZO;
   forming a source electrode and a drain electrode above the IGZO channel layer; and
   wherein the second sub-layer of the IGZO channel layer is formed above the first sub-layer of the IGZO channel layer;
   wherein the forming of the IGZO channel layer comprises:
      forming the first sub-layer of the IGZO channel layer above the gate electrode and heating the first sub-layer of the IGZO channel layer; and
      forming the second sub-layer of the IGZO channel layer after the heating of the first sub-layer of the IGZO channel layer.

2. The method of claim 1, wherein the second sub-layer of the IGZO channel layer has a thickness of between about 3 nm and about 15 nm.

3. The method of claim 2, wherein the first sub-layer of the IGZO channel layer has a thickness of between about 30 nanometers (nm) and about 100 nm.

4. The method of claim 1, wherein the first sub-layer of the IGZO channel layer and the second sub-layer of the IGZO channel layer are formed using physical vapor deposition (PVD).

5. The method of claim 1, further comprising forming a gate dielectric layer above the gate electrode, wherein the IGZO channel layer is formed above the gate dielectric layer.

6. The method of claim 5, further comprising forming a passivation layer above the gate dielectric layer.

7. The method of claim 6, wherein the substrate comprises glass, a semiconductor material, or a combination thereof.

8. A method for forming an indium-gallium-zinc oxide (IGZO) device, the method comprising:
   providing a substrate;
   forming a gate electrode above the substrate;
   forming a gate dielectric layer above the gate electrode;
   forming an IGZO channel layer above the gate dielectric layer, wherein the IGZO channel layer comprises a first sub-layer comprising crystalline IGZO and a second sub-layer comprising amorphous IGZO, the second sub-layer being formed above the first sub-layer;
   forming a source electrode and a drain electrode above the IGZO channel layer;
   wherein the forming of the IGZO channel layer comprises:
      forming the first sub-layer of the IGZO channel layer above the gate dielectric layer and heating the first sub-layer of the IGZO channel layer; and
      forming the second sub-layer of the IGZO channel layer after the heating of the first sub-layer of the IGZO channel layer.

9. The method of claim 8, wherein the first sub-layer of the IGZO channel layer and the second sub-layer of the IGZO channel layer are formed using physical vapor deposition (PVD).

10. The method of claim 8, wherein the first sub-layer of the IGZO channel layer has a thickness of between about 30 nanometers (nm) and about 100 nm, and the second sub-layer of the IGZO channel layer has a thickness of between about 3 nm and about 15 nm.

* * * * *